(12) United States Patent
Oshima et al.

(10) Patent No.: US 7,838,439 B2
(45) Date of Patent: Nov. 23, 2010

(54) METHOD OF MANUFACTURING AN INSULATING FILM CONTAINING HAFNIUM

(75) Inventors: Masaharu Oshima, Tokyo (JP); Haruhiko Takahashi, Tokyo (JP); Koji Usuda, Yokohama (JP); Ziyuan Liu, Kawasaki (JP); Liu Guo-lin, Higashiyamato (JP); Kazuto Ikeda, Ome (JP); Masaki Yoshimaru, Hachioji (JP)

(73) Assignee: Semiconductor Technology Academic Research Center, Yokohama-shi (JP)

( * ) Notice: Subject to any disclaimer, the term of this patent is extended or adjusted under 35 U.S.C. 154(b) by 40 days.

(21) Appl. No.: 12/146,835

(22) Filed: Jun. 26, 2008

(65) Prior Publication Data
US 2009/0004886 A1 Jan. 1, 2009

(30) Foreign Application Priority Data
Jun. 27, 2007 (JP) ............... 2007-169482

(51) Int. Cl.
*H01L 21/31* (2006.01)
*H01L 21/469* (2006.01)
*H01L 21/336* (2006.01)
(52) U.S. Cl. .............. 438/778; 438/287; 438/785; 257/E21.01
(58) Field of Classification Search .......... 438/785; 427/327.2, 377, 397.7
See application file for complete search history.

(56) References Cited

U.S. PATENT DOCUMENTS

2005/0070123 A1* 3/2005 Hirano ............... 438/778
2005/0124121 A1* 6/2005 Rotondaro et al. ...... 438/287

OTHER PUBLICATIONS

H. Takahashi et al, "Chemical reaction at the interface between polycrystalline Si electrodes and $HfO_2$/ Si gate dielectrics by annealing in ultrahigh vacuum", 2005 American Institute of Physics, Applied Physics Letters 87, 012903(2005), published online Jun. 29, 2005, pp. 1-3.
S. Toyoda et al, "Annealing-temperature dependence: Mechanism of Hf silicidation in $HfO_2$ gate insulators on Si by core-level photoemission spectroscopy", 2006 American Insitiute of Physics, Journal of Applied Physics 99, 014901 (2006), Published online Jan. 3, 2006, pp. 1-5.
S. Toyoda et al, "Crystallization in $HfO_2$ gate insulators with in situ annealing studied by valence-band photoemission and x-ray absorption spectroscopy", 2005 American Institute of Physics, Journal of Applied Physics 97, 014507(2005), Published online May 5, 2005. pp. 1-4.

* cited by examiner

*Primary Examiner*—Ha Tran T Nguyen
*Assistant Examiner*—Valerie Brown
(74) *Attorney, Agent, or Firm*—Oblon, Spivak, McClelland, Maier & Neustadt, L.L.P.

(57) ABSTRACT

A stacked film has an insulating film containing hafnium formed above a silicon layer and a polysilicon layer formed on the insulating film. The stacked film is heated in an atmosphere containing oxygen and nitrogen and having the total pressure approximately equal to a partial pressure of the nitrogen.

16 Claims, 5 Drawing Sheets

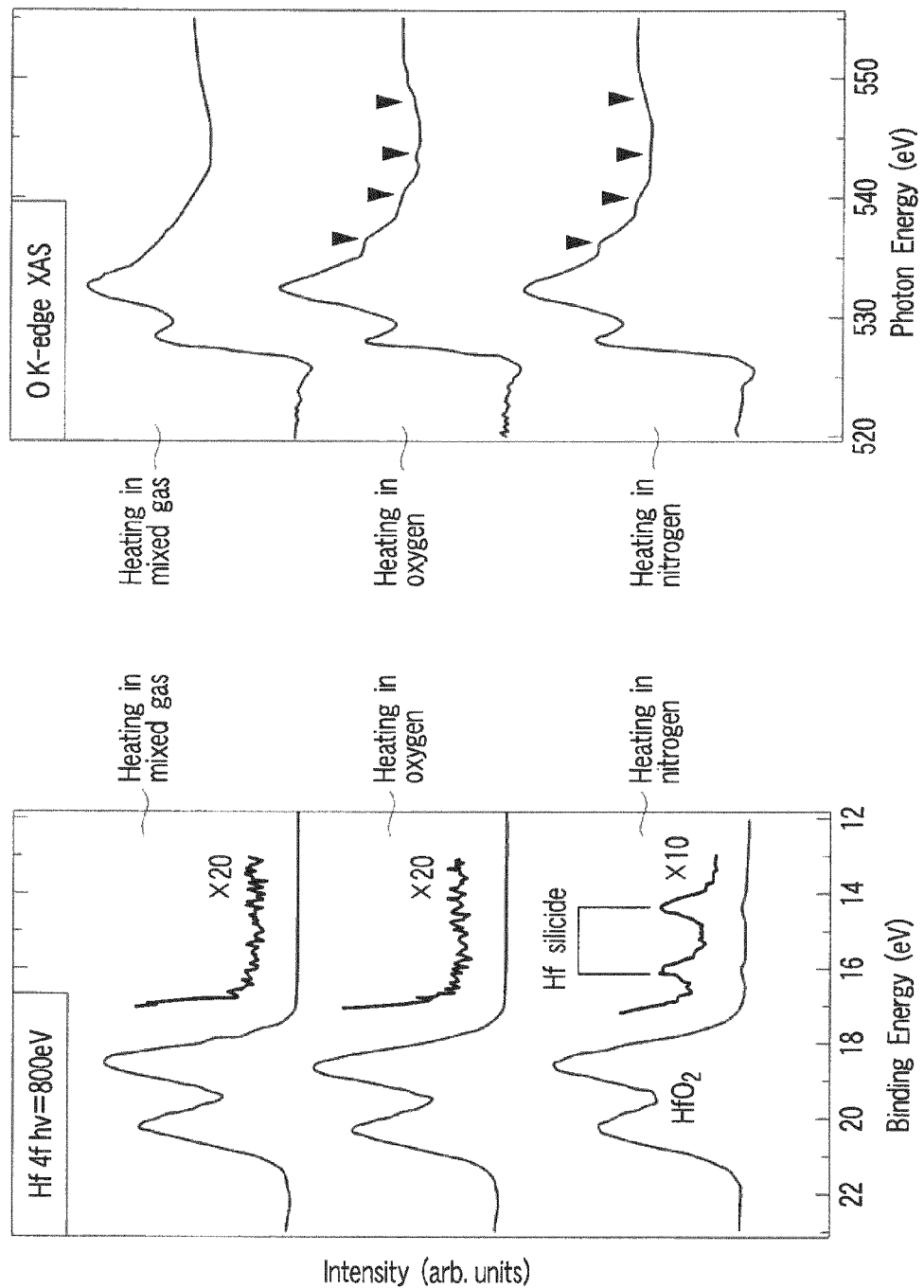
F I G. 3B
F I G. 3A

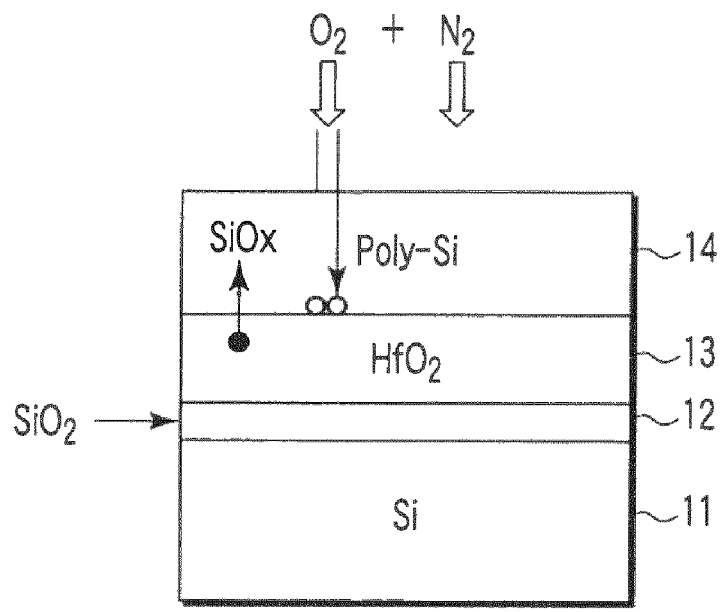
F I G. 5A
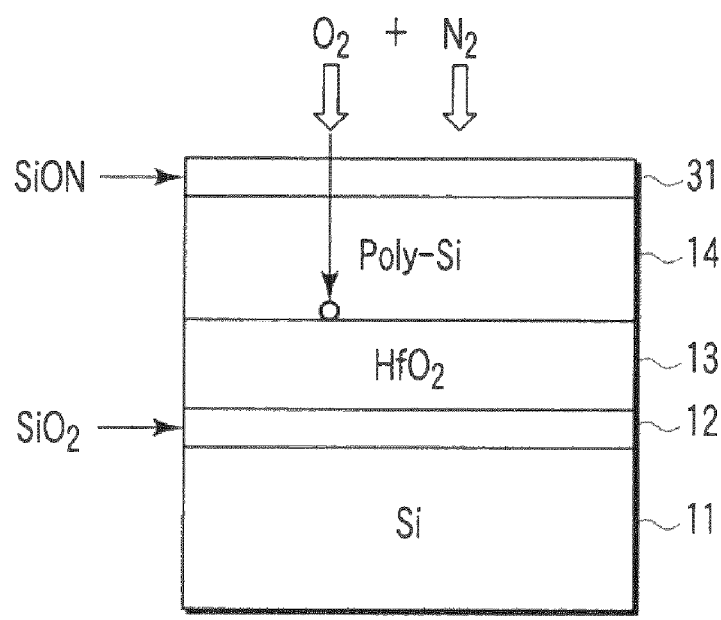
F I G. 5B

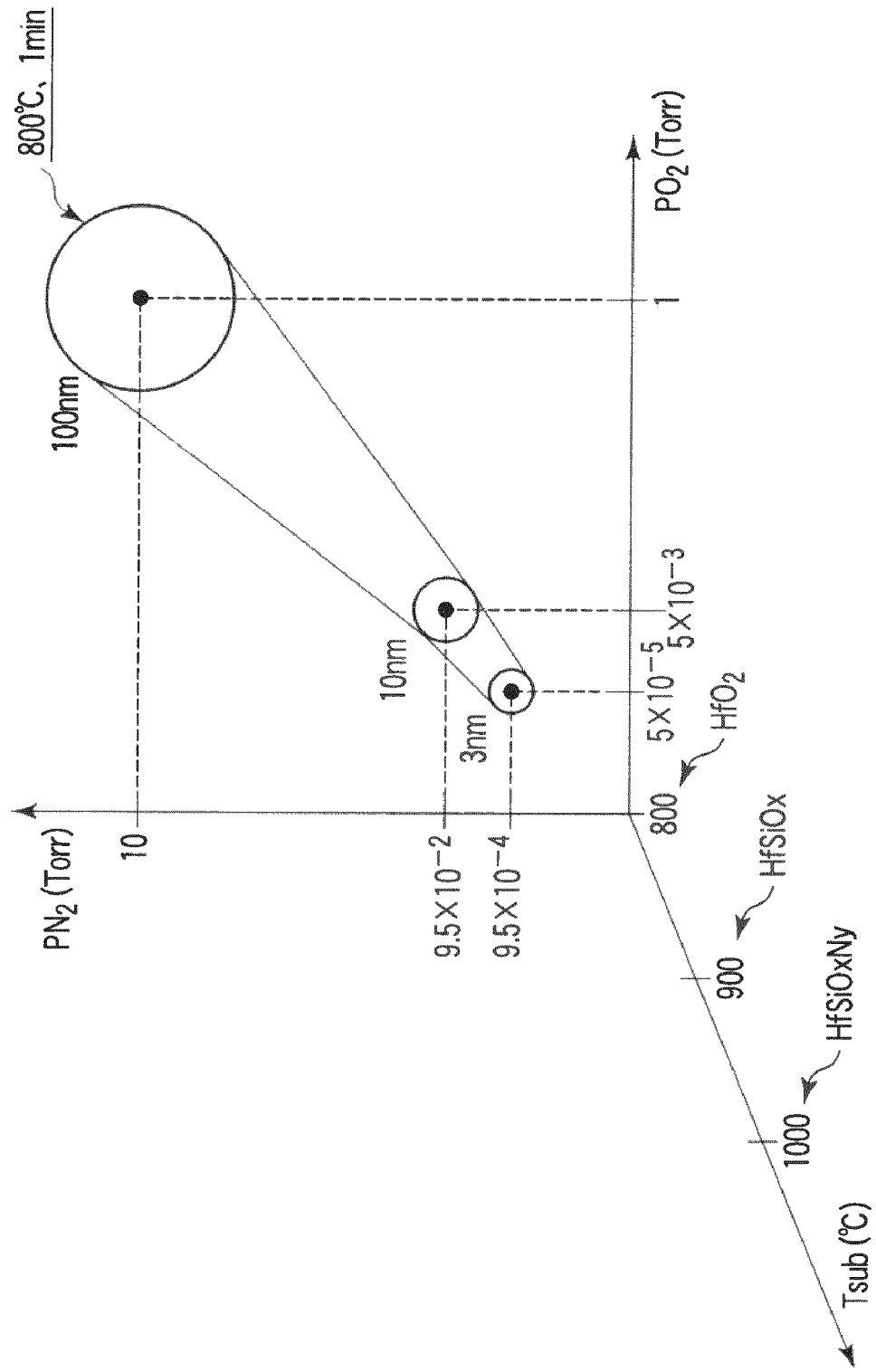
F I G. 6

METHOD OF MANUFACTURING AN INSULATING FILM CONTAINING HAFNIUM

CROSS-REFERENCE TO RELATED APPLICATIONS

This application is based upon and claims the benefit of priority from prior Japanese Patent Application No. 2007-169482, filed Jun. 27, 2007, the entire contents of which are incorporated herein by reference.

BACKGROUND OF THE INVENTION

1. Field of the Invention

The present invention relates to a gate insulating film of a semiconductor device, for example, MOSFET. In particular, the present invention relates to a method of manufacturing an insulating film containing hafnium (Hf).

2. Description of the Related Art

Currently, a silicon oxide film and a silicon nitride film are used as a gate insulating film of a MOSFET. The gate insulating film must be formed having a sub-nm size because scale reduction of the MOSFET advances and its performance is improved. For this reason, a gate leakage current remarkably increases by the direct tunnel effect. Thus, it is difficult to use the silicon oxide employed in the conventional case in future.

In recent years, practically using a high-dielectric-constant material called a high-k material as a gate insulating film has been researched. For example, $HfO_2$ is given as the high-dielectric-constant material. The foregoing $HfO_2$ is very hopeful because it has relatively high dielectric constant and wide band gap.

However, when $HfO_2$ is used as a gate insulating film, the following problem arises. Specifically, silicidation or crystallization of $HfO_2$ is produced at the interface between a $HfO_2$ gate insulating film and a polysilicon layer as a gate electrode by high-temperature heat treatment in the manufacturing process. In other words, if the $HfO_2$ used as the gate insulating film is crystallized, gate leakage current is generated through grain boundaries. For this reason, wasteful power consumption is produced. Moreover, when a part of the gate insulating film is formed as silicide, a current path will arise in the gate insulating film by the silicide.

Thus, there has been made the research of preventing silicidation and crystallization of $HfO_2$ (see T. Takahashi, S. Toyoda, J. Okabayashi, H. Kumigashira, M. Oshima, Y. Sugita, G. L. Liu, Z. Liu, and K. Usuda, "Chemical reaction at the interface between polycrystalline Si electrodes and HfO2/Si gate dielectrics by annealing in ultrahigh vacuum", 2005 American Institute of Physics, Applied Physics Letters 87, 012903 (2005), published online 29 Jun. 2005). According to the research, for example, a $HfO_2$ film is formed on a silicon layer, a sample formed with a polysilicon layer on the $HfO_2$ film is heated in ultrahigh vacuum. In this case, the following reaction occurs, and then, 2SiO is released as gas. Further, silicidation of hafnium is produced, and crystallization of the $HfO_2$ film was confirmed. For this reason, it is difficult to prevent silicidation and crystallization.

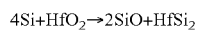

$4Si + HfO_2 \rightarrow 2SiO + HfSi_2$

When the sample is heated in an oxygen atmosphere, and thereby, a generation of SiO and silicidation were prevented. However, excessive oxygen is supplied to the $HfO_2$ film; for this reason, it was difficult to prevent crystallization of the $HfO_2$ film.

In addition, when the sample is heated in a nitrogen atmosphere, and thereby, SiO is produced, and silicidation of the $HfO_2$ film occurs. Therefore, it was difficult to prevent crystallization of the $HfO_2$ film.

As described above, it was conventionally difficult to prevent both of silicidation and crystallization of an insulating film containing hafnium. Therefore, it is desired to a method of manufacturing a semiconductor device, which can prevent both of silicidation and crystallization of an insulating film containing hafnium.

For example, the following document discloses the research of the mechanism of silicidation of the HfO2 film by forming a sample excluding a polysilicon layer from the sample, and heating it in ultrahigh vacuum.

Document: S. Toyoda, J. Okabayashi, H. Takahashi, H. Kumigashira, M. Oshima, M. Niwa. K. Usuda and G. L. Liu, "Annealing-temperature dependence: Mechanism of Hf silicidation in HfO2 gate insulators on si by core-level photoemission spectroscopy", 2006 American Institute of Physics, Journal Of Applied Physics 99, 014901 (2006), Published online 3 Jan. 2006.

In addition, the following document discloses the research of the mechanism of crystallization of the $HfO_2$ film.

Document: S. Toyoda, J. Okabayashi, H. Takahashi, H. Kumigashira, M. Oshima, K. Yamashita, M. Niwa. K. Usuda and G. L. Liu, "Crystallization in HfO2 gate insulators with in situ annealing studied by valance-band photoemission and x-ray absorption spectroscopy", 2005 American Institute of Physics, Journal Of Applied Physics 97, 014507 (2005), Published online 5 May 2005.

BRIEF SUMMARY OF THE INVENTION

According to a first aspect of the invention, there is provided a method of manufacturing a semiconductor device, comprising: forming a stacked film having an insulating film containing hafnium above a silicon layer and a polysilicon layer formed on the insulating film; and heating the stacked film in an atmosphere containing oxygen and nitrogen and having the total pressure approximately equal to a partial pressure of the nitrogen.

According to a second aspect of the invention, there is provided a method of manufacturing a MOS transistor, comprising: forming a stacked film having a gate insulating film containing hafnium above a silicon layer and a polysilicon layer functioning as a gate electrode on the gate insulating film; and heating the stacked film in an atmosphere containing oxygen and nitrogen and having the total pressure approximately equal to a partial pressure of the nitrogen.

BRIEF DESCRIPTION OF THE SEVERAL VIEWS OF THE DRAWING

FIG. 3A shows Hf 4f core level photoelectron spectrum of each heated sample, and FIG. 3B shows 0 K-edge X-ray absorption spectrum of each heated sample;

FIGS. 5A and 5B are views schematically to explain heat treatment mechanism of this embodiment; and FIG. 6 is a view to explain the relationship between an oxygen partial pressure $PO_2$ and a nitrogen partial pressure $PN_2$ when a film thickness of a polysilicon layer is changed under the conditions that heating time and treatment time are set constant.

DETAILED DESCRIPTION OF THE INVENTION

Various embodiments of the present invention will be hereinafter described with reference to the accompanying drawings.

Figure 1:
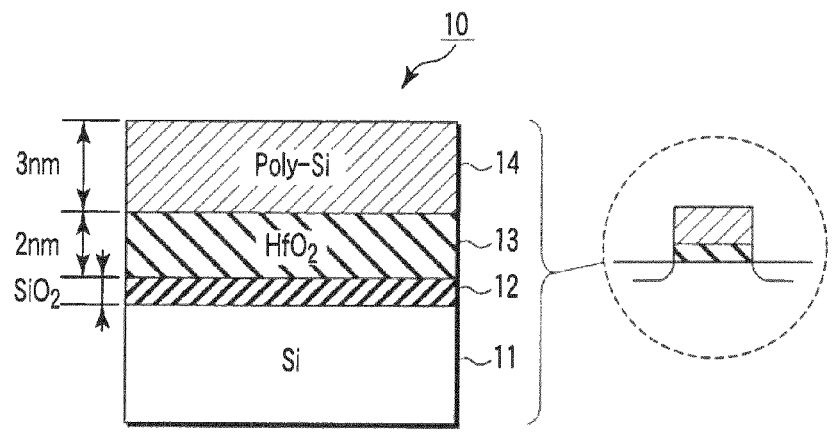
FIG. 1 is a cross-sectional view showing the structure of a sample applied to this embodiment.

FIG. 1 shows a sample of a semiconductor device applied to this embodiment. In a sample 10, a silicon oxide ($SiO_2$) film 12 is formed on a silicon layer (silicon substrate) 11 by thermal oxidization, for example. An $HfO_2$ film 13 is formed on the silicon oxide film 12 by the chemical vapor deposition (CVD) process, for example. A polysilicon layer 14 is formed on the $HfO_2$ film 13 by magnetron sputtering, for example. Thereafter, the surface is cleaned using a diluted hydrofluoric acid solution. The $HfO_2$ film 13 has a film thickness of 2 nm, for example, and the polysilicon layer 14 has a film thickness of 3 nm, for example. The $HfO_2$ film 13 corresponds to a gate insulating film of a MOSFET, and the polysilicon layer 14 corresponds to a gate electrode thereof.

Figure 2:
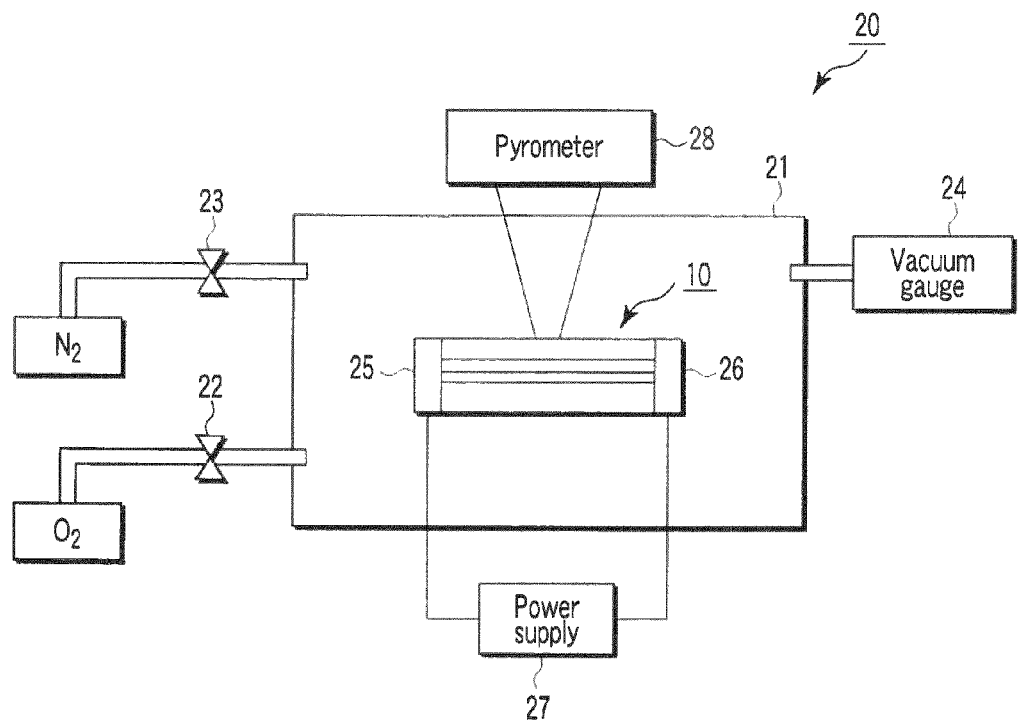
FIG. 2 is a view showing the configuration of a heat treatment apparatus applied to this embodiment.

FIG. 2 shows the configuration of a heat treatment apparatus applied to this embodiment. The heat treatment apparatus 20 includes a chamber 21, which receives the sample 10 shown in FIG. 1. An oxygen gas ($O_2$) is supplied into the chamber 21 via a variable leak valve 22 while a nitrogen gas ($N_2$) is supplied into there via a variable leak valve 23. The gas pressure in the chamber 21 is measured by a vacuum gauge 24.

The sample 10 has electrodes 25 and 26 on both ends, respectively, and a current is supplied to the sample 10 from a power supply 27 through the electrodes 25 and 26. Namely, the sample 10 is heated by supplying the current. In this state, a heating temperature of the sample 10 is measured by an infrared pyrometer 28 provided outside the chamber 21.

According to the configuration, an oxygen partial pressure in the chamber 21 is set to $5 \times 10^{-5}$ Torr, and a nitrogen partial pressure in the chamber 21 is set to $9.5 \times 10^{-4}$ Torr, for example. That is, a partial pressure ratio of oxygen to nitrogen is set to approximately 1:20. The total pressure is set to $1 \times 10^{-5}$ Torr approximately equal to the nitrogen partial pressure. In this state, heat treatment is carried out under the conditions that the heating temperature of the sample 10 is set to 800° C. and heating time is set to one minute, for example.

Thereafter, the sample 10 is taken out of the chamber 21, and then, radiation photoelectron spectrum is measured using a photonspectrometer while X-ray absorption spectrum is measured. The sectional structure of the sample 10 is measured using a transmission electron microscope (TEM). In addition, as a reference experiment, the sample 10 was heated under the same heating condition in a single-gas atmosphere using nitrogen or oxygen only at the same partial pressure.

FIG. 3A shows Hf 4f core level photoelectron spectrum of each heated sample, and FIG. 3B shows 0 K-edge X-ray absorption spectrum of each heated sample.

According to heat treatment using a nitrogen gas only, in photoelectron spectrum as shown in the lowermost characteristic chart of FIG. 3A, the peak component originating in Hf silicide appears. In addition, in absorption spectrum as shown in the lowermost characteristic chart of FIG. 3B, the peak structure originating in crystallization of $HfO_2$ is detected. In other words, according to the heat treatment using a nitrogen gas only, both of silicidation and crystallization of $HfO_2$ are produced. It can be seen that neither silicidation nor crystallization is prevented.

In the heat treatment using an oxygen gas only, as shown in the intermediate characteristic chart of FIG. 3A, the peak component originating in Hf silicide does not appear in photoelectron spectrum. However, in absorption spectrum as shown in the intermediate characteristic chart of FIG. 3B, the peak structure originating in crystallization of $HfO_2$ is detected. Thus, according to the heat treatment using an oxygen gas only, it can be seen that silicidation of $HfO_2$ is prevented, but crystallization is not.

In contrast, according to heat treatment using a mixed gas of oxygen and nitrogen, no peak component appears in photoelectron spectrum resulting from Hf silicide as seen from the uppermost characteristic chart of FIG. 3A. In addition, no peak structure is detected in absorption spectrum resulting from crystallization of $HfO_2$ in the uppermost characteristic chart of FIG. 3B. In other words, it can be seen that both silicidation and crystallization of $HfO_2$ are prevented according to heat treatment using a mixed gas of oxygen and nitrogen.

Figures 4A, 4B, 4C:
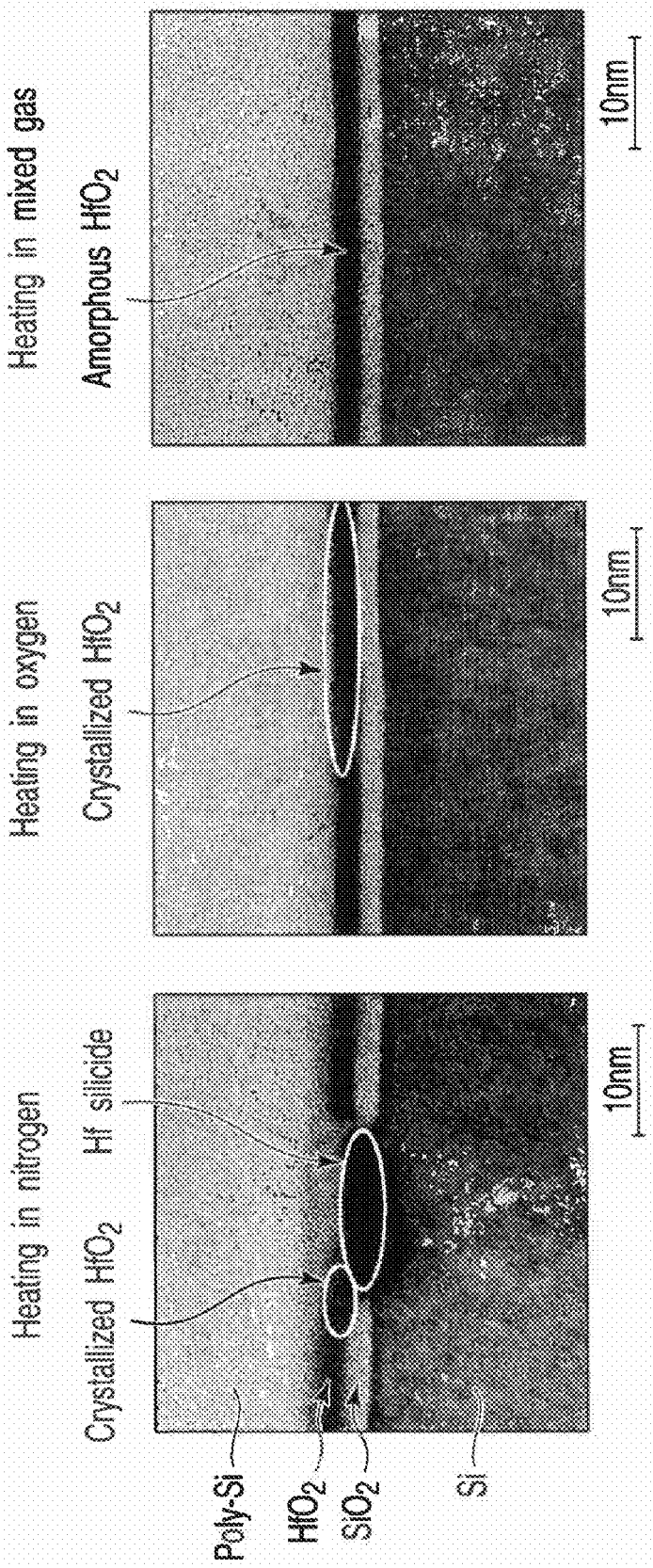
FIGS. 4A, 4B and 4C are each transmission electron micrographs obtained in heat treatment using nitrogen gas only, in heat treatment using oxygen gas only, and in heat treatment using mixed gas of oxygen and nitrogen.

FIGS. 4A, 4B and 4C each show results observed by a transmission electronic microscope of heated samples in heat treatment using a nitrogen gas only, in heat treatment using an oxygen gas only and in heat treatment using a mixed gas of oxygen and nitrogen. As shown in FIG. 4A, according to the heat treatment using a nitrogen gas only, it is confirmed that Hf silicide and crystallized $HfO_2$ exist. As depicted in FIG. 4B, according to the heat treatment using an oxygen gas only, it is confirmed that crystallized $HfO_2$ exist. Conversely, as seen from FIG. 4C, according to the heat treatment using a mixed gas of oxygen and nitrogen, it is confirmed that neither Hf silicide nor crystallized $HfO_2$ exists FIGS. 5A and 5B schematically show the heat treatment mechanism of the embodiment. According to the embodiment, the sample 10 is heated in a mixed gas atmosphere of oxygen and nitrogen. Silicidation of the $HfO_2$ film 13 results from a reducing reaction such that oxygen is released as a SiO gas from the $HfO_2$ film 13 during heat treatment. Crystallization of the $HfO_2$ film 13 results from the supply of excessive oxygen to the $HfO_2$ film 13. In order to prevent the reducing reaction of the $HfO_2$ film 13 and the supply of excessive oxygen, oxygen must be properly supplied at the interface between the $HfO_2$ film 13 and the polysilicon layer. According to the conventional heat treatment using oxygen, the supply of oxygen to the $HfO_2$ film 13 becomes excessive; as a result, silicidation is prevented, but $HfO_2$ is crystallized.

According to this embodiment, heat treatment is carried out using a mixed gas of oxygen and nitrogen as shown in FIG. 5A. In the initial time of the heat treatment, oxygen is supplied at the interface of the polysilicon layer 14 and the $HfO_2$ film 13. This serves to prevent a reducing reaction of the $HfO_2$ film 13 and silicidation of the $HfO_2$ film 13. In addition, a nitrogen gas nitrifies the surface of the polysilicon layer 14 in a heat treatment process as shown in FIG. 5B; as a result, a silicon oxynitride (SiON) film 31 is formed. The SiON film 31 is hard to pass oxygen compared with polysilicon. Thus, the SiON film 31 is formed, and thereby, the supply of oxygen to the $HfO_2$ film 13 is prevented. Therefore, this serves to prevent crystallization of $HfO_2$.

In order to prevent crystallization and silicidation of $HfO_2$, there is a need of controlling oxygen reached at the interface between the $HfO_2$ film 13 and the polysilicon layer 14. The following five parameters used for the foregoing control are given.

(1) Partial pressure of oxygen gas
(2) Thickness of polysilicon layer
(3) Partial pressure of nitrogen gas
(4) Heating temperature
(5) Treatment time According to the embodiment, the thickness of the polysilicon layer 14 is set to 3 nm. However, it is expected in the actual devices that the thickness of the polysilicon layer 14 is set to 3 nm or more. When heating temperature and treatment time are set constant, if the polysilicon layer 14 is formed thicker, diffusion of oxygen is prevented in the polysilicon layer 14. For this reason, the partial pressure of oxygen gas must be set higher in order to prevent crystallization of $HfO_2$.

FIG. 6 is a view to explain the relationship between an oxygen partial pressure $PO_2$ and a nitrogen partial pressure $PN_2$ when the thickness of the polysilicon layer is changed under the condition that heating temperature and treatment time are set constant.

As shown in FIG. 6, when the thickness of the polysilicon layer 14 is 3 nm under the condition that heating temperature using the $HfO_2$ film 13 is 800° C. and treatment time is one minute, the optimum condition of the oxygen partial pressure and the nitrogen partial pressure is as follows. As seen from FIG. 6, the oxygen partial pressure is $5 \times 10^{-5}$ Torr, the nitrogen partial pressure is $9.5 \times 10^{-4}$ Torr, and the total pressure is $1 \times 10^{-3}$ Torr.

When the thickness of the polysilicon layer 14 is 10 nm, the optimum condition of the oxygen partial pressure and the nitrogen partial pressure is as follows. The oxygen partial pressure is set to $5 \times 10^{-3}$ Torr, the nitrogen partial pressure is set to $9.5 \times 10^{-2}$ Torr, and the total pressure is set to 0.1 Torr.

When the thickness of the polysilicon layer 14 is 100 nm, the optimum condition of the oxygen partial pressure and the nitrogen partial pressure is as follows. The oxygen partial pressure is set to 1 Torr, the nitrogen partial pressure is set to 10 Torr, and the total pressure is set to 11 Torr.

In addition, a 50% allowable range is given to the foregoing optimum condition as shown by a solid line circle in FIG. 6.

Specifically, the following pressure range is set when the thickness of the polysilicon ranges from 3 to 100 nm under the condition that heating temperature is 800° C. and treatment time is one minute. The oxygen partial pressure is set to a range from $5 \times 10^{-5}$ Torr to 1 Torr, the nitrogen partial pressure is set to a range from $9.5 \times 10^{-4}$ Torr to 10 Torr, and the total pressure is set to a range from $1 \times 10^{-3}$ Torr to 11 Torr.

According to the embodiment, the heat treatment is rapid thermal annealing (RTA). Even if the treatment time is about 10 seconds when the heating temperature is, for example, 1000° C., the same effect as above is obtained. If the heating temperature is, for example, 700° C., the treatment time is about five minutes, and thereby, the same effect as above is obtained.

According to the embodiment, the silicon layer 11, silicon oxide film 12, $HfO_2$ film 13 and polysilicon layer 14 are successively stacked, and thereby, the sample 10 is prepared. Then, the sample 10 is heated in an atmosphere having the total pressure equivalent to the nitrogen partial pressure using a mixed gas of oxygen and nitrogen. Thus, oxygen is supplied at the interface between the $HfO_2$ film 13 and the polysilicon layer 14. In addition, the surface of the polysilicon layer 14 is nitrified so that a silicon oxynitride (SiON) film 31 is formed. In this way, the SiON film 31 serves to prevent the supply of excessive oxygen to the $HfO_2$ film 13. Therefore, it is possible to prevent both silicidation and crystallization of the $HfO_2$ film 13. As a result, an effective insulating film is formed as a gate insulating film of a MOSFET.

The embodiment relates to the case of using the $HfO_2$ film 13. The present invention is not limited to the $HfO_2$ film 13; in this case, a HfSiOx film and a HfSiON film may be used. If the HfSiOx film is used, crystallization and silicidation are hard to occur compared with the $HfO_2$ film 13. If an HfSiOxNy film is used, crystallization and silicidation are further hard to occur compared with the HfSiOx film. Thus, when the HfSiOx film is used, for example, 900° C. is employed as heating temperature. When the HfSiOxNy film is used, heating temperature higher than above, for example, 1000° C. may be employed.

According to the embodiment, the SiON film 31 on the surface of the polysilicon layer 14 is formed during heat treatment; however, the present invention is not limited to above. For example, the surface of the polysilicon layer 14 may be previously nitrified before heat treatment to form a silicon nitride film. Moreover, the interface between the $HfO_2$ film 13 and the polysilicon layer 14 may be previously nitrified to form a silicon nitride film.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising:
   forming a stacked film including an insulating film containing hafnium above a silicon layer and a polysilicon layer formed on the insulating film; and
   heating the stacked film in an atmosphere containing oxygen and nitrogen and having a condition that a partial pressure of the nitrogen is higher than a partial pressure of the oxygen,
   whereby a SiON film formed on the polysilicon layer which serves to suppress the supply of oxygen to the insulating film containing hafnium to prevent crystallization.

2. The method according to claim 1, wherein
   under the condition that a film thickness of the polysilicon layer ranges from 3 to 100 nm,
   heating temperature is 800° C. and treatment time is one minute,
   a partial pressure of the nitrogen is set to a range of from $9.5 \times 10^{-4}$ to 10 Torr,
   a partial pressure of the oxygen is set to a range of from $5 \times 10^{-5}$ to 1 Torr,
   the partial pressure of the nitrogen is higher than the partial pressure of the oxygen, and
   an allowable range is 50%.

3. The method according to claim 1, wherein
   under the condition that a film thickness of the polysilicon layer ranges from 3 to 100 nm,
   heating temperature is 800° C. and treatment time is one minute, and
   a total pressure as a total of partial pressures of the nitrogen and the oxygen is set to a range of from $1 \times 10^{-3}$ to 11 Torr.

4. The method according to claim 1, wherein
   the heat treatment is carried out under the condition that temperature ranges 1000 to 700° C., and
   treatment time is set to a range of 10 seconds to five minutes.

5. The method according to claim 1, wherein the insulating film containing the hafnium is one of $HfO_2$, HfSiOx and HfSiOxNy.

6. The method according to claim 1, wherein a surface of the polysilicon layer is nitrified.

7. The method according to claim 1, wherein the interface between the polysilicon layer and the insulating film containing hafnium is nitrified.

8. The method according to claim 1, wherein
the insulating film containing hafnium functions as a gate insulating film, and
the polysilicon layer functions as a gate electrode.

9. The method according to claim 1, wherein the atmosphere containing oxygen and nitrogen consists essentially of oxygen and nitrogen and a partial pressure of the nitrogen is higher than a partial pressure of the oxygen.

10. A method of manufacturing a MOS transistor comprising:
forming a stacked film including an insulating film containing hafnium above a silicon layer and a polysilicon layer formed on the insulating film; and
heating the stacked film in an atmosphere containing oxygen and nitrogen and having a condition that a partial pressure of the nitrogen is higher than a partial pressure of the oxygen,
whereby a SiON film formed on the polysilicon which serves to suppress the supply of oxygen to the insulating film containing hafnium to prevent crystallization.

11. The method according to claim 10, wherein
under the condition that a film thickness of the polysilicon layer ranges from 3 to 100 nm,
heating temperature is 800° C. and treatment time is one minute,
a partial pressure of the nitrogen is set to a range of from $9.5 \times 10^{-4}$ to 10 Torr,
a partial pressure of the oxygen is set to a range of from $5 \times 10^{-5}$ to 1 Torr,
the partial pressure of the nitrogen is higher than the partial pressure of the oxygen, and
an allowable range is 50%.

12. The method according to claim 10, wherein
under the condition that a film thickness of the polysilicon layer ranges from 3 to 100 nm,
heating temperature is 800° C. and treatment time is one minute, and
a total pressure as a total of partial pressures of the nitrogen and the oxygen is set to a range of from $1 \times 10^{-3}$ to 11 Torr.

13. The method according to claim 10, wherein
the heat treatment is carried out under the condition that temperature ranges 1000 to 700° C., and
treatment time is set to a range of 10 seconds to five minutes.

14. The method according to claim 10, wherein the insulating film containing the hafnium is one of $HfO_2$, HfSiOx and HfSiOxNy.

15. The method according to claim 10, wherein a surface of the polysilicon layer is nitrified.

16. The method according to claim 1, wherein the interface between the polysilicon layer and the insulating film containing hafnium is nitrified.

* * * * *